(12) United States Patent
Amar et al.

(10) Patent No.: US 12,302,540 B2
(45) Date of Patent: May 13, 2025

(54) INVERTER WITH CAPACITOR DISCHARGE AND COOLING SYSTEM

(71) Applicant: DANA TM4 INC., Boucherville (CA)

(72) Inventors: Mohammed Amar, Montreal (CA); Francois Dube, Montreal (CA); Maalainine El Yacoubi, Sainte Julie (CA); Michel Brazeau, Delson (CA); Marc-Antoine Beaupré, Mont-Saint-Hilaire (CA)

(73) Assignee: DANA TM4 INC., Boucherville (CA)

( * ) Notice: Subject to any disclaimer, the term of this patent is extended or adjusted under 35 U.S.C. 154(b) by 309 days.

(21) Appl. No.: 18/160,242

(22) Filed: Jan. 26, 2023

(65) Prior Publication Data

US 2024/0260240 A1 Aug. 1, 2024

(51) Int. Cl.
*H02M 7/00* (2006.01)
*H05K 7/20* (2006.01)

(52) U.S. Cl.
CPC ........ *H05K 7/20927* (2013.01); *H02M 7/003* (2013.01); *H05K 7/20272* (2013.01)

(58) Field of Classification Search
CPC ........ H02M 7/003; H02M 1/327; H02M 1/44; H05K 7/20927; H05K 7/1432; H05K 7/2089; H05K 5/0247; H05K 7/209; H05K 5/04; H05K 7/20327; H05K 9/0081; H02K 5/203
USPC .......................................................... 361/699
See application file for complete search history.

(56) References Cited

U.S. PATENT DOCUMENTS

| | | | |
|---|---|---|---|
| 5,091,523 A | * | 2/1992 | Talebian ................. A61P 35/00 536/17.3 |
| 8,665,623 B2 | | 3/2014 | Suzuki et al. |
| 8,780,557 B2 | | 7/2014 | Duppong et al. |
| 9,300,221 B2 | | 3/2016 | Asako |
| 9,615,490 B2 | | 4/2017 | Topolewski et al. |

(Continued)

FOREIGN PATENT DOCUMENTS

| | | |
|---|---|---|
| WO | 2010127654 A2 | 11/2010 |
| WO | 2018028988 A1 | 2/2018 |

OTHER PUBLICATIONS

Brazeau, M. et al., "Inverter With Housing Chambers for Electromagnetic Interference (EMI) Reduction," U.S. Appl. No. 17/934,150, filed Sep. 21, 2022, 24 pages.

(Continued)

*Primary Examiner* — Mandeep S Buttar
(74) *Attorney, Agent, or Firm* — McCoy Russell LLP (57) ABSTRACT

A system is shown for cooling components of an inverter. In one example, an inverter comprises a first compartment including a direct current (DC) link capacitor that is electrically coupled to a discharge resistor; and a thermal pad in contact with the DC link capacitor; a cooling system configured to circulate coolant through a housing adjacent to the thermal pad; and a noise filtering ferrite element coupled to a DC bus bar. A cooling plate may be further included between the DC link capacitor and the thermal pad and during a during a first condition when the inverter is operating, heat is transferred from the DC link capacitor to the cooling system; and during a second condition when the inverter is not operating, heat is reduced in the DC link capacitor by discharging electricity stored in the DC link capacitor via the discharge resistor.

17 Claims, 7 Drawing Sheets

(56) References Cited

U.S. PATENT DOCUMENTS

| | | | |
|---|---|---|---|
| 10,498,250 B2 | 12/2019 | Takahashi et al. | |
| 10,512,197 B2 | 12/2019 | Ishibashi et al. | |
| 11,282,640 B2 | 3/2022 | Nguyen et al. | |
| 2016/0106011 A1* | 4/2016 | Mizuno | H05K 7/20927 |
| | | | 361/699 |
| 2016/0241155 A1* | 8/2016 | Takeuchi | H05K 7/20263 |
| 2017/0063203 A1 | 3/2017 | Doo | |
| 2018/0358903 A1* | 12/2018 | Takahashi | H02M 7/003 |
| 2021/0099072 A1 | 4/2021 | Uryu | |
| 2021/0274690 A1 | 9/2021 | Cho et al. | |
| 2023/0071172 A1* | 3/2023 | Fujiwara | H03H 7/0115 |
| 2024/0097577 A1* | 3/2024 | Brazeau | H02M 1/0009 |

OTHER PUBLICATIONS

Brazeau, M. et al., "Inverter With Capacitor Discharge and DC Bus Filtering," U.S. Appl. No. 18/054,094, filed Nov. 9, 2022, 27 pages.

* cited by examiner

INVERTER WITH CAPACITOR DISCHARGE AND COOLING SYSTEM

TECHNICAL FIELD

The present disclosure relates to an inverter designed with connectors between a direct current (DC) link capacitor and a control circuit board and a cooling system to reduce heat in the DC link capacitor.

BACKGROUND AND SUMMARY

Inverters are used in a variety of fields to change direct current (DC) to alternate current (AC). Inverters are used in a variety of fields such as electric vehicles, solar installations, industrial equipment, etc. Inverters use power modules that switch at high frequency to enable the DC to AC conversion functionality.

Increases in power and reductions in size and cost of inverters over time have increased an amount of heat generated by the inverters. The increased heat may be absorbed by components of the inverter, including the DC link capacitor, passive discharge resistors, phase output bus bars, and other components. The increased heat may reduce a useful life of the DC link capacitor and other components. Previous inverters have exhibited issues with regard to premature degradation as well as undesirable complexity. Consequently, certain prior inverters may be costly from a manufacturing perspective and may not achieve lifespan targets in some cases.

US 2018/0358903 A1 to Takahashi et al. discloses a power converter for an all-electric or hybrid electric vehicle. The power converter includes a smoothing capacitor and a discharge resistor that is electrically connected to the capacitor via the positive and negative bus bars in an attempt to decrease the amount of heat transferred to the capacitor.

The inventors have recognized several drawbacks with Takahashi's power converter and other previous power converters. For instance, Takahashi's power converter, as well as other power converters, may experience over-temperature conditions in the bus bars.

The inventors have recognized the aforementioned challenges and developed an inverter assembly to at least partially overcome the challenges. In one example, the inverter assembly comprises a first compartment including a direct current (DC) link capacitor that is electrically coupled to a discharge resistor via two bus bars; and a thermal pad in contact with the DC link capacitor; a cooling system configured to circulate coolant through a housing adjacent to the thermal pad; and a noise filtering ferrite element coupled to to a DC bus bar. The discharge resistor may be configured to discharge the DC link capacitor when the inverter assembly is turned off. In this way, the capacitor is discharged when the inverter is turned off and the resistor which provides the discharge functionality is cooled, to avoid the chance of the resistor experiencing an over-temperature condition. Consequently, thermal management in the inverter is enhanced. Additionally, the inverter assembly includes a cooling plate positioned underneath the DC link capacitor, which may increase an amount of heat transferred from the DC link capacitor to the thermal pad and cooling system. Thus, during operation of the inverter, the amount of heat in the DC link capacitor is reduced via the cooling plate, thermal pad, and cooling system, and when operation of the invertor ceases, the amount of heat in the DC link capacitor is reduced via the discharge resistor. In this way, the cooling plate, thermal pad, and cooling system may be used in conjunction with the discharge resistor to maintain the heat of the DC link capacitor within acceptable thresholds, reducing the over-temperature conditions in the bus bars, extending the lifespan of various components of the inverter assembly, and decreasing an overall cost of the inverter assembly.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Various aspects of this disclosure may be better understood upon reading the following detailed description and upon reference to the drawings, in which.

DETAILED DESCRIPTION

An inverter is described herein that strategically reduces heat in a direct current (DC) bus bar assembly, and achieves enhanced thermal management for internal componentry. The inverter described herein may further achieve increased space efficiency and reduced complexity, if desired. To attain at least some of these characteristics, the inverter includes a DC link capacitor electrically connected a control circuit board via multiple connectors (e.g., connection bus bars or springs) and a ferrite filter that is fixed to a DC bus bar. The inverter further includes a discharge resistor configured to discharge the capacitor when the inverter is turned off and coupled to the control circuit board, and cooling components that facilitate a transfer of heat from the capacitor to a cooling system during operation of the inverter. The cooling components include a cooling plate and a thermal pad arranged between the capacitor and the cooling system.

Figure 1:
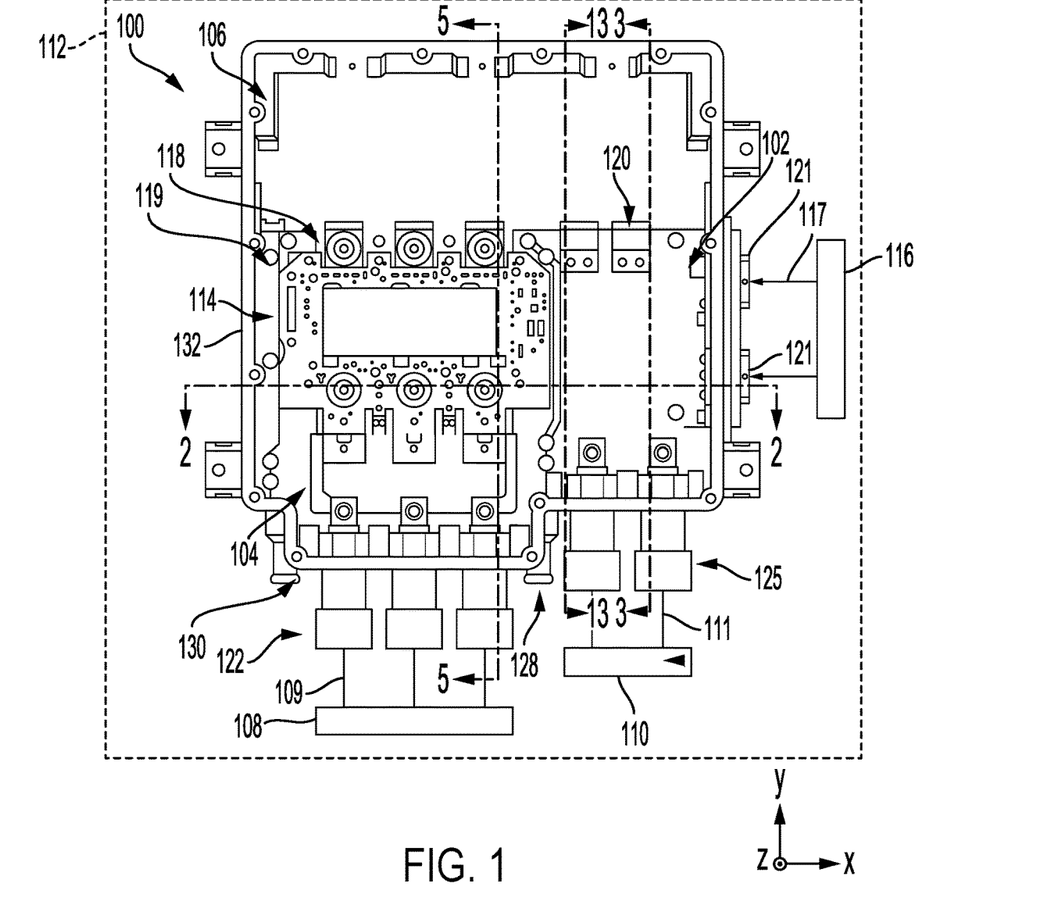
FIG. 1 is an illustration of an inverter and an exemplary operating environment in which it may be utilized.

FIG. 1 depicts an inverter 100 that is designed to convert DC to alternating current (AC). To achieve this functionality, the inverter 100 includes a DC bus bar assembly 102 and an AC bus bar assembly 104 which are both electrically connected to a DC link capacitor 106 either directly or indirectly. To form the internal electrical connections in the inverter described herein conductive plates, harnesses, capacitors, cables, combinations thereof, and the like may be used to establish these connections. Similarly, cables, harnesses, combinations thereof, and/or other suitable components for establishing electrical connections may be used to electrically couple the inverter to external components. However, cables, under some operating conditions, function as antennas which pick up electromagnetic interference (EMI) noise. Therefore, use of extraneous cables within the inverter may be reduced (e.g., avoided) to diminish internal EMI.

The inverter 100 may be coupled to an alternating current (AC) electrical component 108 and a DC electrical component 110 (e.g., a vehicle energy storage system, in an electric vehicle (EV) embodiment). Cables 109 and 111 and/or other suitable electrically conductive components may be used to electrically couple the AC electrical component 108 and the DC electrical component 110 to the inverter 100. In one example, the inverter 100 may be included in an EV 112 or other suitable electric system, and may be referred to as a power electronics unit, in the EV example. In such an example, the inverter adjusts the speed of a traction motor in the vehicle. The EV 112 may be a light, medium, or heavy duty vehicle. In such an example, the AC electrical component 108 may be a traction motor and the DC electrical component 110 may be a traction battery. However, it will be understood that the inverter may be included in a variety of environments. For example, the inverter 100 may be included in a solar power installation, an industrial machine, and the like.

Further, the inverter 100 may include a gate-driver circuit board (e.g., a gate-driver printed circuit board assembly (PCBA)) 114 that is designed to control the power distributed by the inverter 100. For instance, in the EV example, the gate-driver circuit board 114 adjusts the amount of power supplied to the traction motor to alter the motor's speed. However, as indicated above the inverter may be used in a variety of operating environments. The gate-driver circuit board 114 and the other circuit boards described herein may include one more microprocessors, memory, and the like to achieve the power adjustment functionality. A control circuit board 310 (e.g., the control PCBA), shown in FIG. 3, may receive electrical energy and receive signals from and send signals to a lower voltage component 116 as indicated via arrows 117. To elaborate, electrical connectors 121 that form an external communication interface serve as the connection between the lower voltage component 116 and a flexible circuit board electrically connected to the control circuit board 310, shown in FIG. 3 and discussed in greater detail herein. The lower voltage component may include a lower voltage power supply and/or a controller. As such, this electrical energy may have a lower voltage than the electrical energy flowing into and out of the inverter via the connectors 122 and 125.

As illustrated in FIG. 1, the DC link capacitor 106 is electrically coupled to a power module 119 (e.g., a power transistor module) via an electrical interface 118 (e.g., DC bus bar interface). The electrical interface 120 between the DC bus bar assembly 102 and the DC link capacitor 106 is further depicted. Further, electrical connectors 122 that facilitate efficient electrical coupling between phase bus bars in the AC bus bar assembly 104 and the AC electrical component 108 are additionally illustrated in FIG. 1. DC input connectors 125 that facilitate efficient electrical coupling between DC bus bars in the DC bus bar assembly 102 and the DC electrical component 110 (e.g., the vehicle's energy storage system, as indicated above) are further illustrated in FIG. 1. However, other arrangements of the power module and the DC link capacitor have been contemplated.

In the illustrated example, a coolant inlet 128 and a coolant outlet 130 are further included in the inverter 100. A housing 132 may include coolant conduits through which the coolant circulates and removes heat from the inverter 100. Suitable cooling system components may be hydraulically coupled to the coolant inlet and outlet such as one or more pumps, a heat exchanger, a filter, and the like. The coolant may include water, glycol, combinations thereof, and the like. However, the cooling system may have a different configuration, in other examples.

Figure 2:
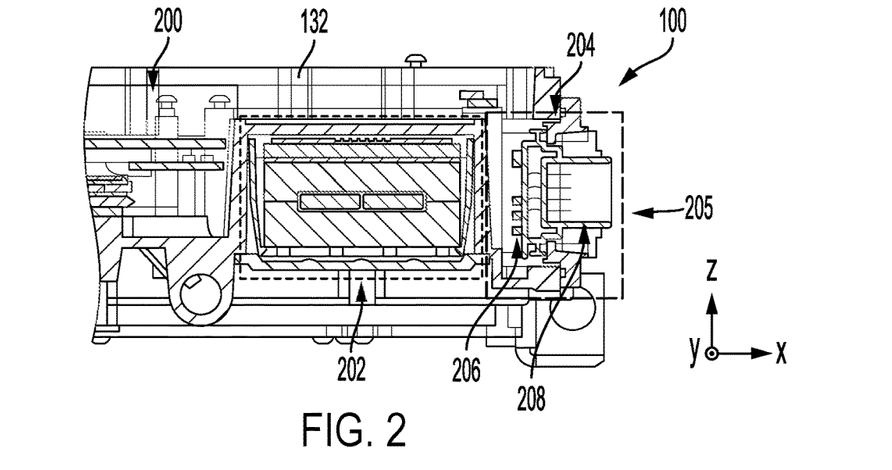
FIG. 2 is a cross-sectional view of the inverter, depicted in FIG. 1, with the cross-section extending through multiple chambers in the housing.
Figure 3:
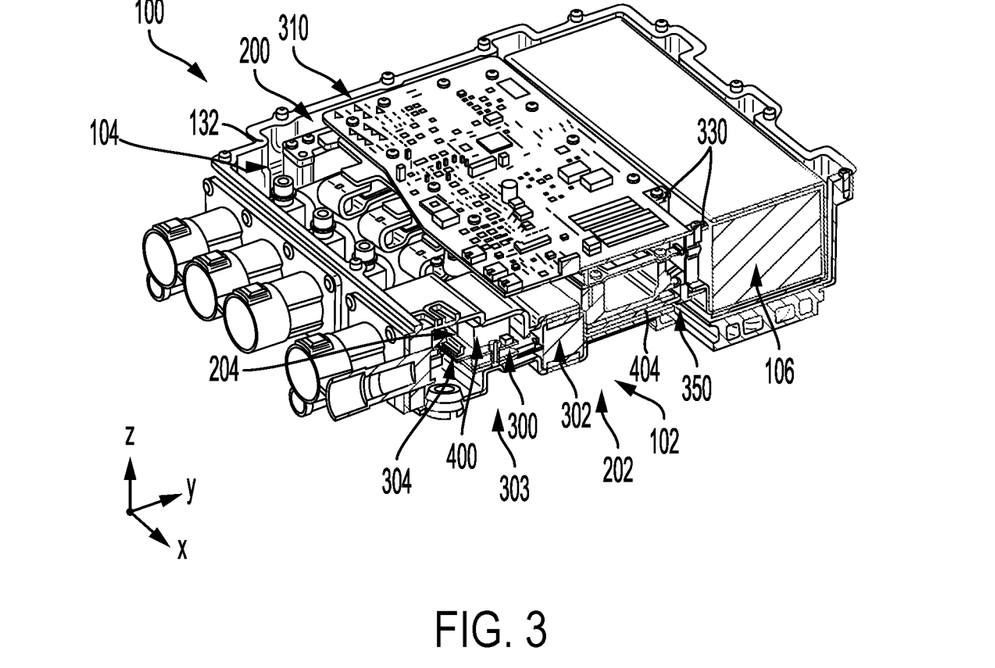
FIG. 3 is a cross-sectional view of the inverter, depicted in FIG. 1, with the cross-section extending through a direct current (DC) assembly.
Figure 5:
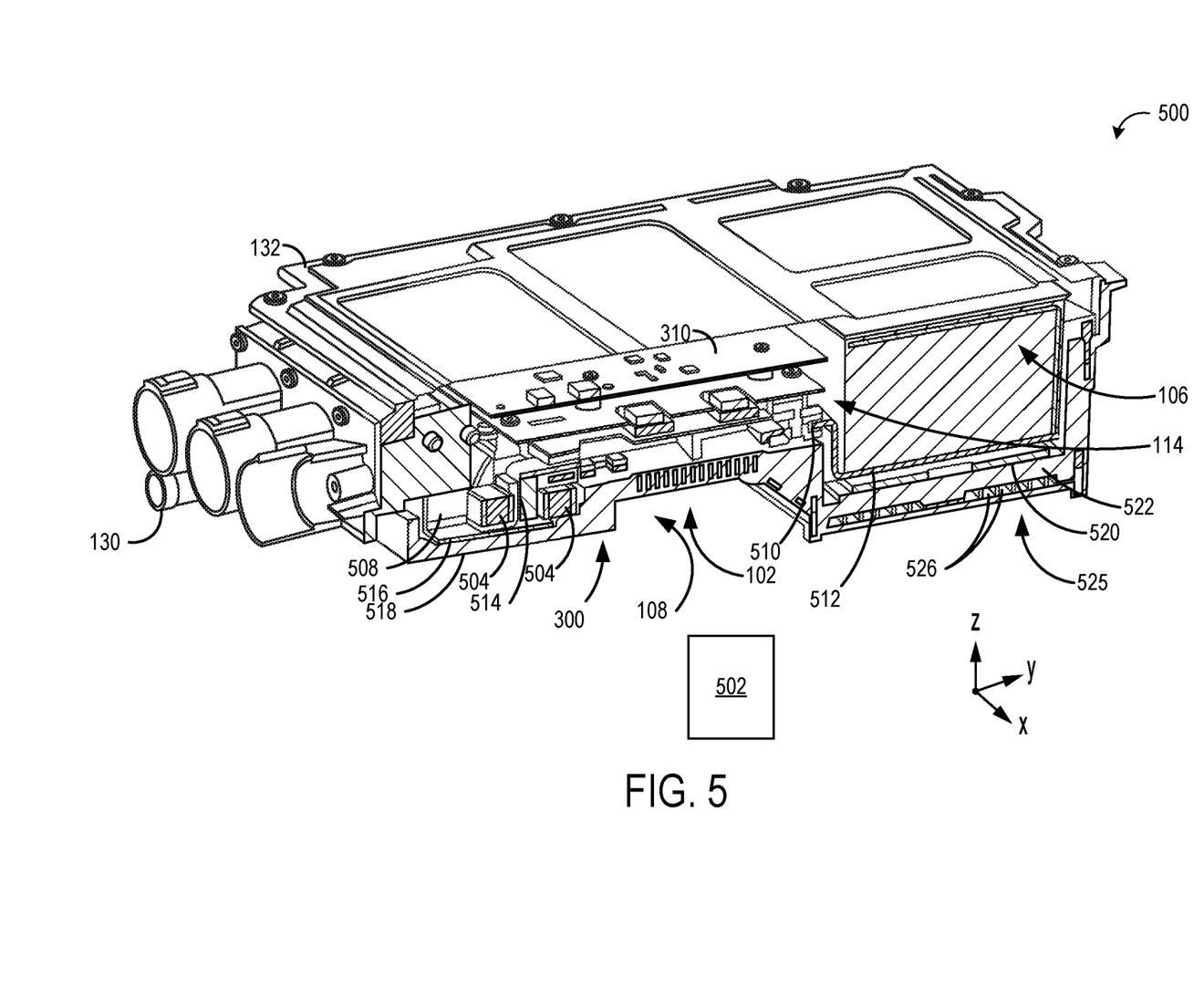
FIG. 5 is a cross-sectional view of the inverter, depicted in FIG. 1, with the cross-section extending through the DC bus bar assembly.

An axis system is provided in FIG. 1 as well as FIGS. 2-9, for reference. The z-axis may be a vertical axis (e.g., parallel to a gravitational axis), the x-axis may be a lateral axis (e.g., horizontal axis), and/or the y-axis may be a longitudinal axis, in one example. However, the axes may have other orientations, in other examples. Cutting planes 2-2, 3-3, 5-5, and 13-13 indicating the locations of the cross-sectional views depicted in FIGS. 2, 3, and 5 are provided for reference in FIG. 1.

FIG. 2 shows a cross-sectional view of the inverter 100. The inverter 100 in the illustrated example, include multiple compartments or chambers within the housing 132. These chambers include a phase-control chamber 200, a DC chamber 202 (e.g., DC separated chamber), and/or an external communication chamber 204. Partitioning the housing into these chambers enables EMI to be reduced, enabling the inverter to be more compliant to electromagnetic emissions targets. The phase-control chamber 200 contains (e.g., fully encloses) the gate-driver circuit board 114, the AC bus bar assembly 104 depicted in FIG. 1, and partially encloses a control circuit board 310, shown in FIG. 3.

Further, the DC chamber 202 contains the DC bus bar assembly 102 depicted in FIG. 1, and the external communication chamber 204 may contain LV communication components (e.g., a communication circuit board 206, connectors 208, and the like) designed to interface with components external to the inverter. The phase-control chamber 200 may have greater noise than the DC chamber. Additionally, the external communication chamber may have less noise than the DC chamber. In this way, the external communication chamber is designed to protect the LV signals from the noise present in the phase-control chamber.

The DC chamber 202 may be positioned laterally between the phase-control chamber 200 and the external communication chamber 204 (e.g., lower voltage (LV) chamber) and the external communication chamber 204 is positioned on a lateral side 205 of the inverter 100. Partitioning the housing into these chambers enables EMI to be reduced thereby increasing inverter 100 performance. The phase-control chamber 200 contains (e.g., at least partially encloses) the gate-driver circuit board 114 and the AC bus bar assembly 104 depicted in FIG. 1, the DC chamber 202 contains the DC bus bar assembly 102 depicted in FIG. 1, and the external communication chamber 204 may contain external communication components (e.g., a communication circuit board 206, connectors 208, and the like) designed to interface with components external to the inverter. The phase-control chamber 200 may have a greater amount of EMI than the DC chamber 202. Additionally, the external communication chamber 204 may have less EMI than the DC chamber 202. The different chambers may be demarcated via walls of the housing 132.

FIG. 3 shows a cross-sectional view of the inverter 100 with internal features of the DC bus bar assembly 102 revealed. The AC bus bar assembly 104 and the capacitor 106 are again depicted. The control circuit board 310 is further illustrated in FIG. 3. The control circuit board 310 is designed to alter an amount of electric power distributed from the power electronics unit to the external AC electrical component 108 (e.g., the traction motor).

The DC bus bar assembly 102 includes an entry cavity 300 and a ferrite filter 302. The ferrite filter 302 may be formed in multiple sections, in some examples. The construction of the ferrite filter is expanded upon herein with regard to FIG. 4.

The entry cavity 300 may contain an EMI PCB assembly 303. In the illustrated example, the EMI PCB assembly 303 includes EMI filtering capacitors 400 and an electrical connector 304 that is designed to electrically connect to the gate-driver circuit board 114, shown in FIG. 1. The DC bus bar assembly 102 is positioned in the DC chamber 202 of the housing 132, as previously discussed. However, in alternate examples, the DC chamber and the external communication chamber may form a single chamber.

FIG. 3 further shows one of the DC bus bars 404 and connectors 330 that electrically couple the control circuit board 310 to the DC link capacitor 106. The connectors 330 and the DC bus bars 404 are further described herein. Further, the control circuit board 310 is shown positioned in the phase-control chamber 200 and the DC bus bars 404 are shown positioned in the DC chamber 202.

Figure 4:
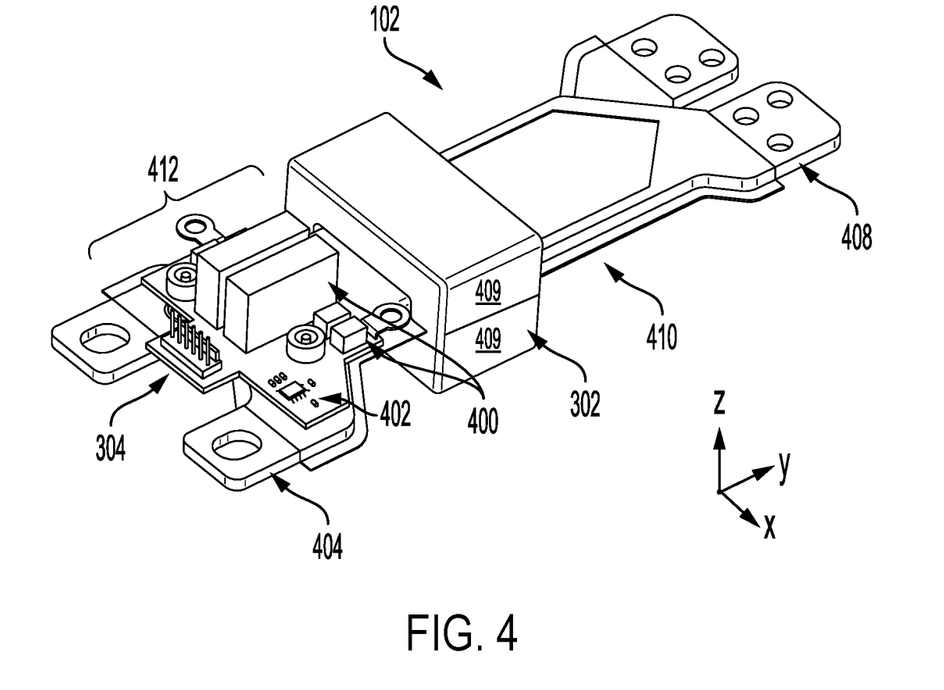
FIG. 4 is a detailed perspective view of the DC bus bar assembly in the inverter, depicted in FIG. 1.

FIG. 4 shows a detailed view of the DC bus bar assembly 102 with DC bus bars 404 which include holes or other suitable features that enable the DC bus bars to function as an electrical input interface (e.g., bolted electrical input interface) to the DC input connectors 125, shown in FIG. 1. The DC bus bar assembly 102 further includes output bus bars 408 (e.g., bolted electrical output interface) that is coupled to the capacitor 106, shown in FIG. 1, when assembled. The output bus bars 408 includes tabs with openings to enable a robust electrical connection to be established. The DC bus bars 404 and the other bus bars described herein may be constructed out of a suitable conductive material such as copper, aluminum, brass, combinations thereof, and the like.

In the illustrated example, the ferrite filter 302 is included in the DC bus bar assembly 102. The ferrite filter 302 is designed to reduce EMI noise exiting the inverter, towards the DC electrical component 110, shown in FIG. 1. Consequently, the inverter may be placed closer to the DC electrical component, if desired. Specifically, in the illustrated example, the ferrite filter 302 extends around the body 410 of the assembly at a mid-portion thereof. However, in other examples, the ferrite filter may have a different contour (e.g., positioned on an upper or lower side of the body of the bus bar assembly) and/or may be placed in a different location along the bus bar assembly. In the illustrated example, the body 410, the bus bars 404, and the bus bars 408 form a continuous shape. However, other bus bar assembly configurations may be used, in other examples.

The ferrite filter 302 may be constructed with different ferrite filter sections 409. These sections may specifically include an upper section and a lower section that when brought together surround the body 410 of the DC bus bar assembly 102. Designing the ferrite filter in multiple sections allows the DC bus bar assembly to be more efficiently constructed. The ferrite filter sections 409 may have a C-type shape to enable the filter to contour to the bus bar body 410, thereby increasing the DC bus bar assembly's space efficiency.

The ferrite filter 302 may specifically be a common-mode filter which selectively removes noise in a targeted frequency range while allowing signals in another frequency to pass, in one example. In this way, the DC bus bar assembly may precisely filter out undesirable noise.

The DC bus bar assembly 102 further includes an EMI filtering and current sensing circuit board 412. In the illustrated example, the EMI filtering and current sensing circuit board 412 includes the EMI filtering capacitors 400, the current sensor 402 (e.g., hall effect sensor), and the connector 304 (e.g., the signal harness). The current sensor 402 reads the DC current flowing through the DC bus bars 404. The connector 304 sends signals to the control circuit board 310, shown in FIG. 3. Wires may be used to send the signals between the connector 304 and the control circuit board 310. The EMI filtering capacitors 400 decrease the amount of EMI noise coming out of the inverter towards the external DC electrical component 110 (towards the vehicle high-voltage power distribution system).

The EMI filtering and current sensing circuit board 412 with the sensing and filtering components may be positioned between the DC bus bars 404 and the ferrite filter 302, in relation to the y-axis. In this way, the circuitry on the board may be protected from EMI, thereby increasing inverter performance in comparison to inverters without the EMI filtering features described herein.

Further, positioning the EMI filtering and current sensing circuit board 412 near the DC input connectors 125, shown in FIG. 1, allows the current sensor to have closer proximity to the DC bus bars 404 than other locations such as near the rear of the DC bus bar assembly 102. In this way, the current sensor reading may be simplified which enables the signal to be processed using less processing resources, if wanted.

It will also be appreciated that a field concentrator may be omitted from the inverter due to the placement of the EMI filtering and current sensing circuit board 412 near the input connectors 125, shown in FIG. 1, (e.g., near the front of the DC bus bar assembly 102), if wanted. When the field concentrator is omitted, the DC current sensor signal may be filtered and compensated to remove the AC components from the signal. The DC current signal processing may contain one or more of the following processing strategies: offset calibration; gain calibration; low-pass filtering; and external field cancellation (e.g., the removal of influence from nearby conductors such as the phase bus bars).

FIG. 5 shows a cross-sectional view 500 of an embodiment of the inverter 100. Inverter 100 shows DC bus bar assembly 102 electrically connected to the DC link capacitor 106, and the gate-driver printed circuit board (PCB) assembly 114 including the control PCB 310 of FIG. 3, which may receive electrical energy from a power supply 502. As described above, this electrical energy may have a lower voltage than the electrical energy flowing into and out of the inverter.

The depicted embodiment shows entry cavity 300, where the entry cavity 300 includes a ferrite filter with a first side 504 and a second side 506). DC bus bar assembly 102 may include various bus bars, of which a first multi-phase bus bar 508 and a second bus bar 510 are depicted, where second bus bar 510 is electrically coupled to DC link capacitor 106 via a connector 512 (e.g., a DC bus bar interface). In various embodiments, first side 504 and second side 506 of the ferrite filter may be positioned such that a section 514 of first multi-phase bus bar 508 is arranged between ferrite filter sides 504 and 506 to reduce an amount of undesirable EMI noise exiting inverter 100 toward an external AC electrical component (e.g., AC electrical component 108 of FIG. 1). Multi-phase bus bar 508 may further include a section 516 that extends under (with regard to the z-axis of the reference coordinates) first side 504 and second side 506 of the ferrite filter, where section 516 may provide a thermal interface to a cooling surface 518 under the multi-phase bus bar 508.

During operation of inverter 100, heat may accumulate in the DC link capacitor 106. As the heat increases, an efficiency of inverter may decrease. Additionally, the increased heat may increase a degradation of various components of inverter 100 and/or reduce a useful life of the various components. To reduce the amount of heat accumulated in the DC link capacitor 106, the inverter 100 may include conductive components that increase a transfer of heat out of the inverter 100. The conductive components may include a thermal pad 520 positioned between the DC link capacitor 106 and a lower portion 522 of housing 132 (e.g., an inverter case). The conductive components also include a cooling system 525 positioned at a bottom side of the DC link capacitor 106 (e.g., in the z-dimension). Cooling system 525 may include a plurality of channels 526, through which a coolant may be flowed. As the coolant flows through the channels 526 of cooling system 525, heat may be transferred from DC link capacitor 106 to the coolant via the thermal pad 520, thereby reducing the amount of heat in DC link capacitor 106.

The coolant may enter inverter 100 via a coolant inlet (e.g., the inlet 128 of FIG. 1), which may allow the coolant to enter into the plurality of channels 526 forming the cooling system 525. The cross-sectional view 500 shows the coolant outlet 130, through which the coolant may exit the inverter 100. Housing 132 may include coolant conduits through which the coolant circulates and removes heat from the inverter 100, which are described in greater detail below in reference to FIG. 8. Additional cooling system components may be hydraulically coupled to the coolant inlet 128 and/or the coolant outlet 130 such as one or more pumps, a heat exchanger, a filter, and the like. The coolant may include water, glycol, combinations thereof, and the like. However, in other examples, oil may be used as the coolant. Thermal pad 520, cooling system 525, and the cooling of the DC link inverter is described in greater detail below in reference to FIGS. 6-9.

Figure 6:
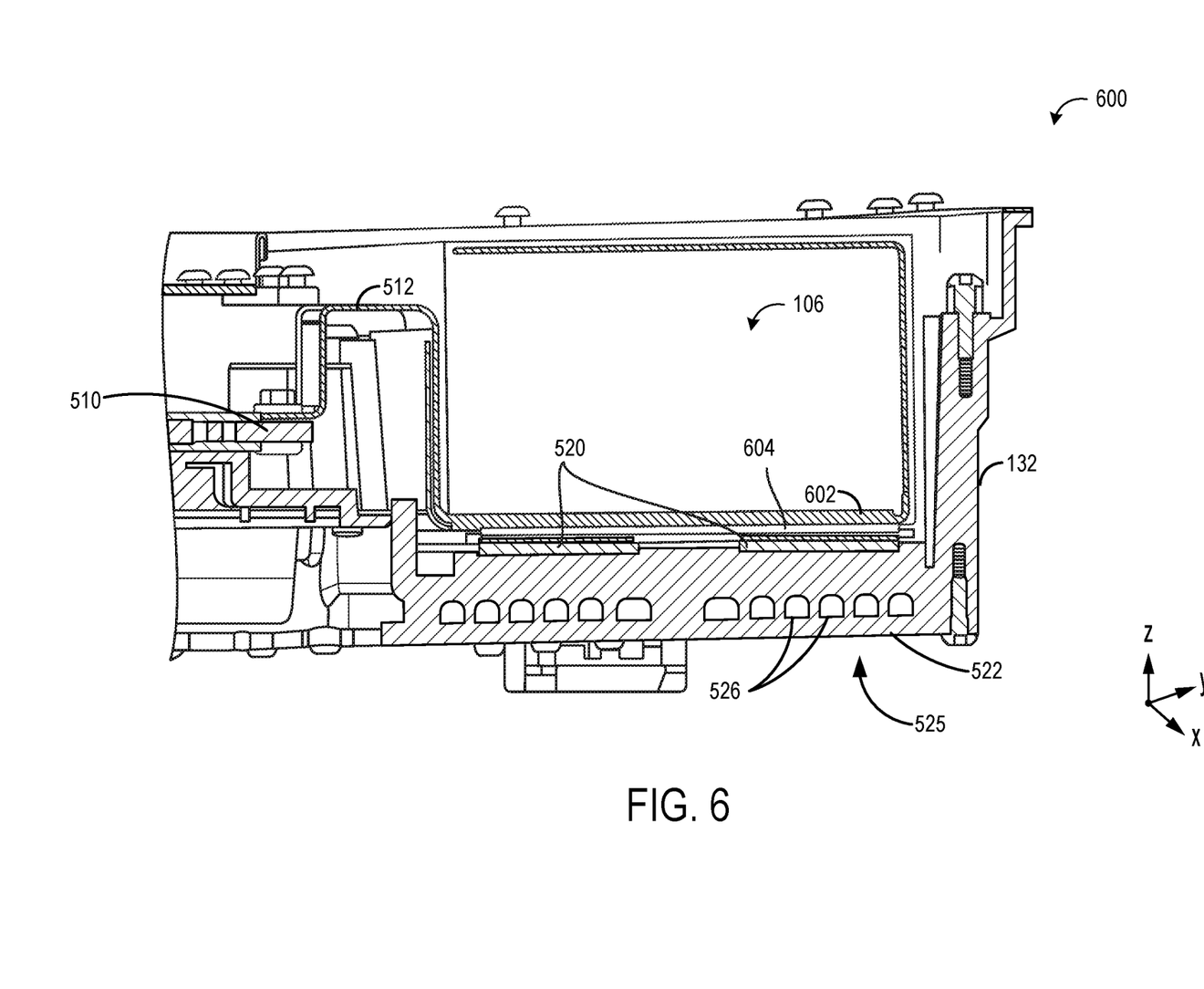
FIG. 6 is an expanded view of a portion of the cross-sectional view of the inverter of FIG. 5.

FIG. 6 shows an expanded view 600 of a portion of the embodiment of inverter 100 shown in FIG. 5. Specifically, expanded view 600 shows DC link capacitor 106, where a lower portion 602 of DC link capacitor 106 is electrically coupled to second bus bar 510 via electric connector 512. Thermal pad 520 is positioned below (e.g., in the z-dimension) lower portion 602, such that heat in DC link capacitor 106 is transferred to thermal pad 520. Additionally, a cooling plate 604 is advantageously positioned between lower portion 602 and thermal pad 520, to more efficiently transfer heat to housing 132 (e.g., the inverter case). For example, in one embodiment, the DC link capacitor 106 is packaged in a case made of one or more materials (e.g., plastic) including the cooling plate as the bottom of the case. In this way, the DC link capacitor 106 is positioned adjacent to the cooling system 525, where lower portion 602 of the DC link capacitor 106 is separated from an upper surface of the cooling system by the cooling plate 604 and the thermal pad 520. The cooling plate 604 may be in face-sharing contact with the lower portion 602 of the DC link capacitor 106, and the cooling plate 604 may be in face-sharing contact with an upper surface of the thermal pad 520. In this way, a greater amount of heat can be removed from the DC link capacitor.

In various embodiments, the cooling plate 604 may be made of aluminum, or a suitable conductive material such as copper, brass, combinations thereof, and the like. An advantage of the cooling plate 604 is that it has a higher thermal conductivity compared to a plastic case (180 W/mK for an aluminum plate versus 0.25 W/mK for a polyphenylene sulfide material) As described above, the heat may be transferred away from DC link capacitor 106 via the coolant flowing through channels 526 of cooling system 525, positioned at lower portion 522 of housing 132. The transfer of heat from DC link capacitor 106 may be passively implemented without any control inputs.

Additionally, in some embodiments, additional cooling plates 604 may be used, or the cooling plate 604 may include multiple surfaces, such that the DC link capacitor 106 is in contact (e.g., in face-sharing contact) with the additional cooling plates 604 or plurality of surfaces. In such embodiments, the channels 526 of the cooling system 525 may be arranged to be adjacent to the additional cooling plates 604 or plurality of surfaces, to increase a transfer of heat from the DC link capacitor 106 to the coolant.

Figure 7:
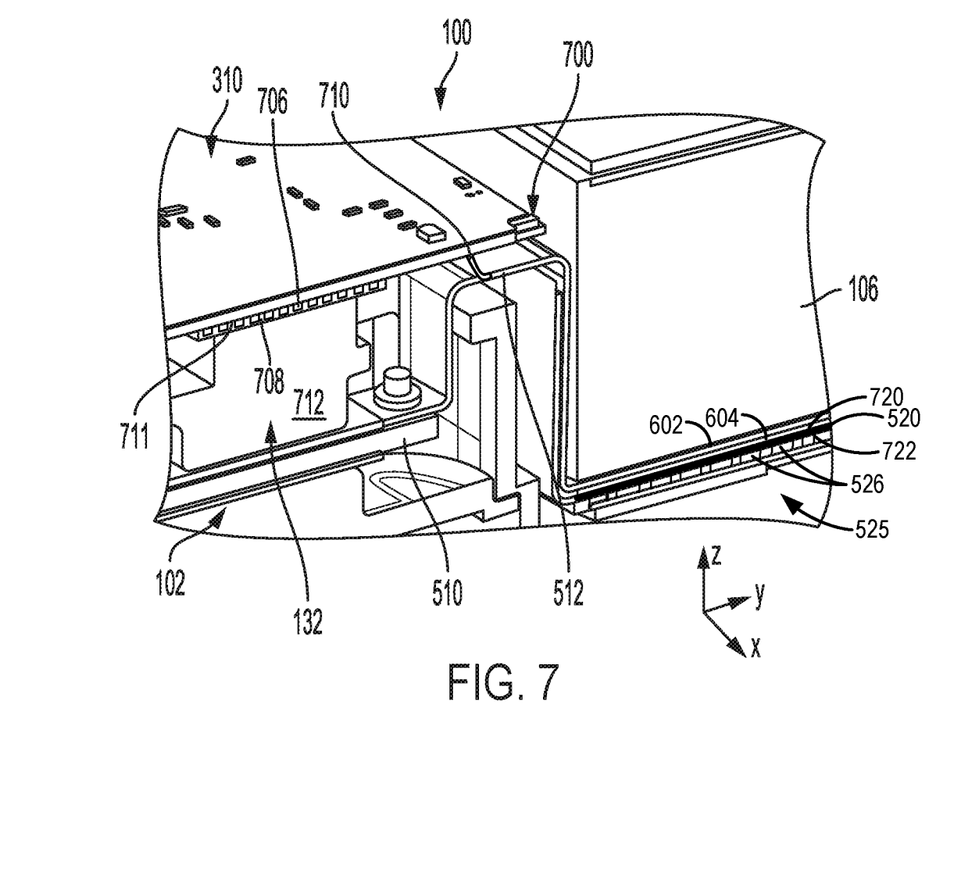
FIG. 7 is an expanded view of an embodiment of the inverter of FIG. 5 including a discharge resistor.

FIG. 7 shows a section of the inverter 100. The inverter 100 depicted in FIG. 7 has a current sensor 700 positioned on the control circuit board 310 as opposed to the EMI filtering and current sensing circuit board. FIG. 7 further shows discharge resistors 706 coupled to the control circuit board 310. In the illustrated example, the discharge resistors 706 are coupled to the control circuit board 310 and a thermal pad 708. To elaborate, the discharge resistors 706 may be in thermal contact with the housing 132 by way of the thermal pad 708. The discharge resistors 706 may be positioned in recesses in the thermal pad 708 to increase the amount of heat transferred from the resistors to the housing. Sections of the thermal pad 708 between the recesses may be in contact with a lower surface 711 of the of the control circuit board 310. The discharge resistor 706 discharges the DC link capacitor 106 when the inverter assembly is turned off. The discharge functionality of the resistor 706 may be passively implemented without any control inputs.

The thermal pad 708 may be coupled to the lower surface 711 of the control circuit board 310 and a section 712 of the housing that is coupled to the DC bus bar assembly 102. Designing the inverter with the resistors 706 and the thermal pad 708 allows the space efficiency of the inverter to be increased and further enables the number of circuit boards in the inverter to be reduced, if desired.

The discharge resistors 706 may decrease an amount of heat accumulated in the DC bus bar assembly 102 by facilitating a discharge of electricity when an operation of the inverter 100 ceases. Alternatively, during the operation the inverter 100, the amount of heat accumulated in the discharge resistors 706 and the DC bus bar assembly 102 may be reduced by the cooling system 525, which may draw heat from the DC link capacitor 106 via the cooling plate 604 positioned at lower surface 602 of the DC link capacitor 106 and the thermal pad 520.

Figure 8:
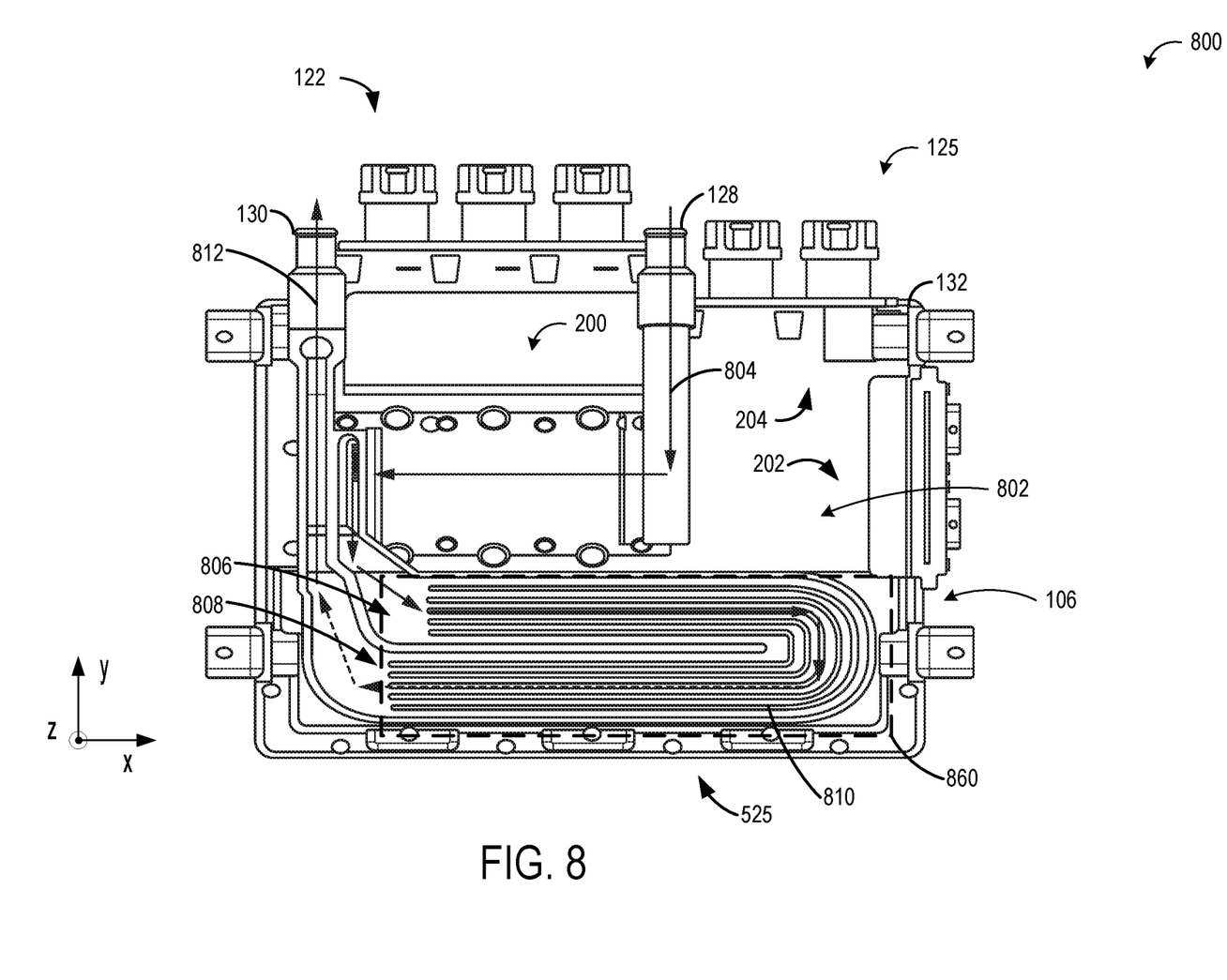
FIG. 8 is a bottom view of the inverter.
Figure 9:
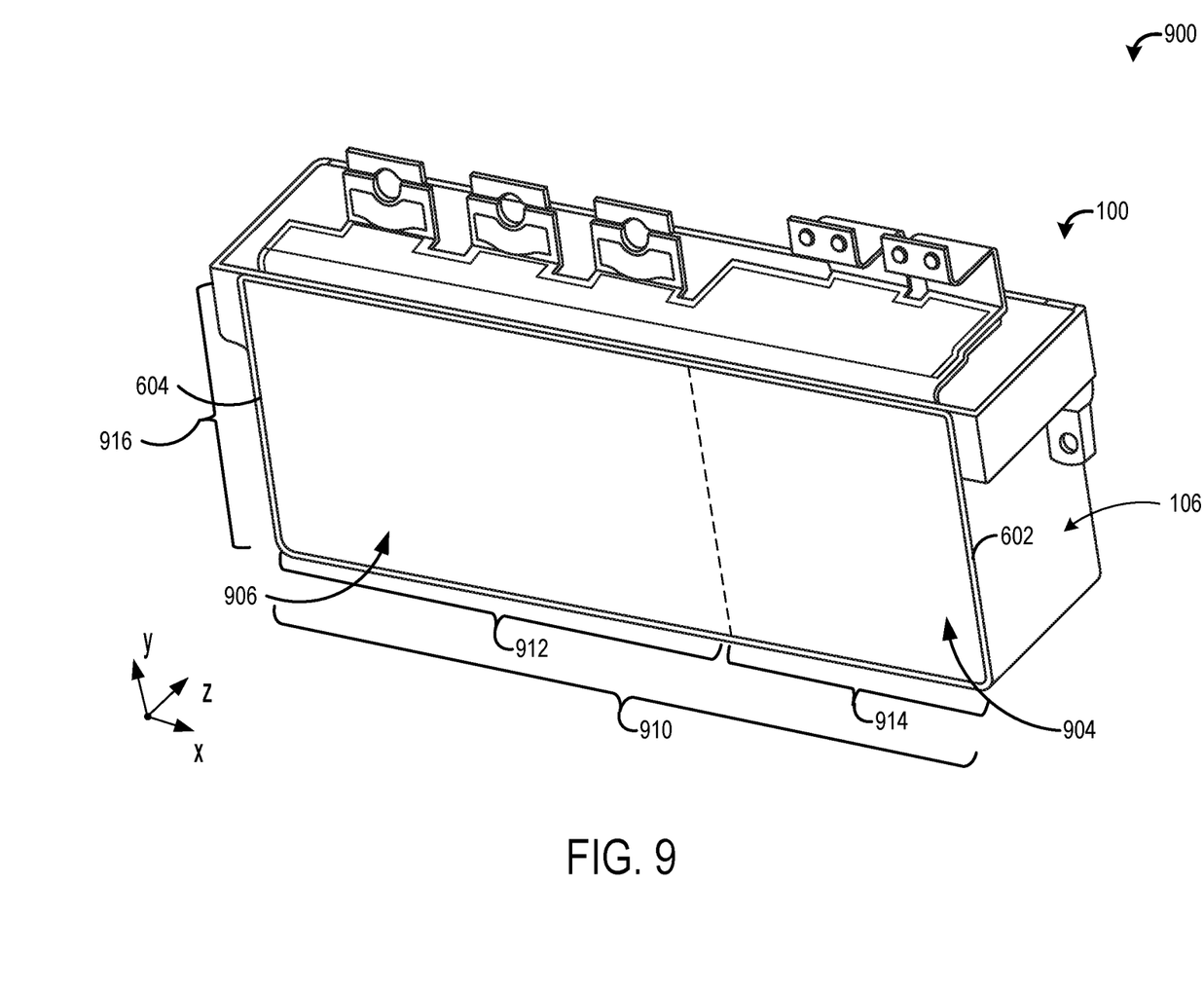
FIG. 9 is a perspective view of a cooling plate positioned underneath a DC link capacitor of the inverter.

Referring briefly to FIG. 9, a perspective view 900 of an underside of the inverter 100 is shown (e.g., in the z dimension), according to an embodiment. In the depicted embodiment, perspective view 900 shows the cooling plate 604 positioned at lower surface 602 of DC link capacitor 106. The cooling plate 604 may be manufactured out of a conductive material which may diminish temperature variability in different portions of the inverter 100, such that the heat may be more efficiently transferred to the cooling system 525. In the depicted embodiment, the cooling plate 604 has a first extent 910 in the x dimension and a second extent 916 in the y dimension, where the cooling plate 604 extends across an entire lower surface of the inverter 100. One advantage of the cooling plate 604 extending across the entire lower surface is that heat accumulated in various components of the inverter 100 (e.g., the DC bus bar assembly 102, AC bus bar assembly 104, PCBA 114, control circuit board 310, etc.) may be distributed across the cooling plate 604. In other embodiments, the cooling plate 604 may not extend across the entire lower surface of the inverter 100. For example, the cooling plate 604 may extend across a first portion 904 of entire lower surface, with a first extent 914 in the x dimension and the second extent 916 in the y dimension, and may not extend across a second portion 906 of the entire lower surface, the second portion 906 having a first extent 912 in the x dimension and the second extent 916 in the y dimension. In other embodiments, dimensions of the cooling plate 604 may be adjusted in either the y dimension or the x dimension, or both the y dimension and the x dimension. In some embodiments, the dimensions of the cooling plate 604 may depend on a size and/or dimensions of the cooling system 525 positioned below the inverter 100. The cooling system 525 is described in greater detail below in reference to FIG. 8.

Returning to FIG. 7, the thermal pad 520 may advantageously increase the transfer of heat from the DC link capacitor 106 and the cooling plate 604 to the cooling system. Specifically, the thermal pad 520 may facilitate a more even distribution of heat transferred and ensure adequate contact between a lower surface 720 of the cooling plate 604 and an upper surface 722 of the cooling system 525 (e.g., a portion of the housing 132 forming an upper part of the channels 526). In one example, the thermal pad 520 has a thermal conductivity between 1 to 3 W/(m·K) and a maximum thickness of 2 mm.

FIG. 7 further shows an electrical spring connector 710 that provides an electrical connection between the control circuit board 310 and the connector 512. The electrical spring connectors 710 may be used in addition to or as an alternative as the connectors 330, shown in FIG. 3. In other embodiments, the electrical spring connectors 710 may not be included, and an electrical connection between the control circuit board 310 and the connector 512 may be achieved in a different manner. For example, in some embodiments, the electrical spring connectors 710 may be replaced with one or more bar buses between the DC bus bar and the control circuit board 310.

FIG. 8 shows a bottom view 800 of an embodiment of inverter 100, where the cooling system 526 is arranged below the DC link capacitor 106. The AC electrical connectors 122 and the DC input connectors 125 are illustrated, along with a bottom surface 802 of housing 132. Bottom view 800 further shows coolant outlet 130 and coolant inlet 128, with coolant conduits 810 that traverse the housing 132. The coolant conduits 810 may create the channels 526 indicated in FIGS. 5, 6, and 7. In the depicted embodiment, the coolant conduits 810 traverse a section of the housing 132 which holds the DC link capacitor 106.

During operation of the inverter 100, coolant may be flowed via a pump (not depicted in FIG. 8) into the inverter 100 via inlet 128, in a direction indicated by an arrow 804. The coolant may be directed into a first end 806 of the coolant conduits 810, and the coolant may circulate through the coolant conduits 810 and flow out of the coolant conduits 810 at a second end 808 of the coolant conduits 810. Specifically, the coolant may be flowed directly from the inlet 128 to a location of the DC link capacitor 106, indicated by a dashed rectangle 860, where the coolant conduits 810 are arranged adjacent to (e.g., underneath) the DC link capacitor. In other words, the coolant conduits 810 may not be arranged adjacent to other components or compartments of the inverter 100. For example, in the embodiment depicted in FIG. 8, the coolant conduits 810 are not arranged underneath the phase-control chamber 200, the DC chamber 202, and/or the external communication chamber 204. Thus, the coolant is specifically directed to a portion of the inverter 100 including the DC link capacitor 106 where an amount of heat generated may be greatest. In this way, a transfer of heat from the DC link capacitor 106 to the coolant may be maximized, increasing an efficiency of the inverter 100. The coolant may then be directed in a direction shown by an arrow 812 to exit the inverter 100 via the outlet 130. The coolant may be directed to a sump, where a temperature of the coolant may be reduced and heat from the inverter 100 may be transferred and dissipated. In this way, the inverter 100 may be effectively and efficiently cooled. In contrast to other heat removal features of the inverter 100 included in phase-control chamber 200, the DC chamber 202, and/or the external communication chamber 204, such as the discharge resistors 706, the cooling system 525 strategically and advantageously removes heat from selected areas, to allow the inverter to be operated within a desired temperature range while also meeting space efficiency requirements.

Thus, an inverter is disclosed including various innovations that collectively reduce heat generated in the inverter, thereby increasing an overall efficiency of the inverter and extending the useful lives of various components included in the inverter. During operation of the inverter, heat generated in a DC link capacitor of the inverter is transferred to a cooling plate at a bottom surface of the DC link capacitor. The cooling plate enables a more even heat distribution, which is then transferred to the cooling system. A thermal pad positioned between the cooling plate and the cooling system ensures a maximum contact and conductivity between the cooling plate and the cooling system, further increasing the heat transfer and reducing the amount of heat in the DC link capacitor. The cooling system comprises a plurality of conduits or channels through which a coolant is flowed, from an inlet into the inverter to an outlet of the inverter, to transfer the heat out of the inverter. Additionally, when operation of the inverter ceases, discharge resistors may be employed to discharge the DC link capacitor. In this way, the discharge resistors and the cooling system including the cooling plate and thermal pad may be used in conjunction to reduce accumulated heat of the inverter and DC link capacitor under a desired heat threshold. By reducing and the accumulated heat, degradation of components of the inverter may be reduced, a lifespan of the components may be increased, and the inverter may perform more efficiently.

As a further advantage of the inverter disclosed herein, the inverter may include a plurality of compartments (e.g., chambers), each compartment of the plurality of compartments enclosing different components of the inverter. Each compartment may have a different level of electromagnetic interference (EMI). The DC bus bar assembly and discharge resistors may be included in one compartment of the plurality of compartments, while other components may be included in other compartments. For example, in one embodiment, a control circuit board may be enclosed in a second compartment, and external communication components may be enclosed in a third compartment. By enclosing the different components in different compartments, overall EMI effects may be reduced, increasing an efficiency of the inverter.

The technical effect of reducing heat in the DC link capacitor via the cooling plate, thermal pad, and cooling system during operation of the inverter, and reducing the heat via the discharge resistors when the inverter is not operating, is that an efficiency of the inverter may be increased and a lifespan of components of the inverter may be increased.

The disclosure also provides support for an inverter, comprising: a first compartment including: a direct current (DC) link capacitor that is electrically coupled to a discharge resistor, and a thermal pad in contact with the DC link capacitor, a cooling system configured to circulate coolant through a housing adjacent to the thermal pad, and a noise filtering ferrite element coupled to a DC bus bar. In a first example of the system, the system further comprises: a cooling plate arranged at a surface of the DC link capacitor between the DC link capacitor and the thermal pad. In a second example of the system, optionally including the first example, the cooling plate is manufactured out of aluminum. In a third example of the system, optionally including one or both of the first and second examples, the cooling plate includes a portion positioned between the DC link capacitor and the cooling system, and a portion positioned between other components of the inverter and the cooling system. In a fourth example of the system, optionally including one or more or each of the first through third examples, one or more dimensions of the cooling plate depend on a positioning of the cooling system adjacent to the cooling plate. In a fifth example of the system, optionally including one or more or each of the first through fourth examples, the DC link capacitor is electrically coupled to the discharge resistor via an electrical spring connector. In a sixth example of the system, optionally including one or more or each of the first through fifth examples, the DC link capacitor is electrically coupled to the discharge resistor via one or more bar busses between a DC bus bar of the inverter and a control circuit board of the inverter. In a seventh example of the system, optionally including one or more or each of the first through sixth examples, the discharge resistor is in thermal contact with a housing of the invertor via a thermal pad. In an eighth example of the system, optionally including one or more or each of the first through seventh examples, the discharge resistor is positioned within a recess of the thermal pad, the recess designed to increase an amount of heat transferred from the discharge resistor to the housing. In a ninth example of the system, optionally including one or more or each of the first through eighth examples, sections of the thermal pad are in contact with a lower surface of a control circuit board. In a tenth example of the system, optionally including one or more or each of the first through ninth examples, a discharge functionality of the discharge resistor is passively implemented without any control inputs. In an eleventh example of the system, optionally including one or more or each of the first through tenth examples, the system further comprises: a second compartment including a control circuit board, wherein the first and second compartment have varying levels of electromagnetic interference (EMI). In a twelfth example of the system, optionally including one or more or each of the first through eleventh examples, the system further comprises: a third compartment with external communication components positioned therein, wherein the first, second, and third compartment have varying levels of EMI.

The disclosure also provides support for a cooling system for an inverter, the cooling system comprising: a plurality of coolant conduits through which a coolant is directed to transfer heat out of the inverter, the plurality of coolant conduits adjacent to a surface of a direct current (DC) link capacitor of the inverter, and a discharge resistor electrically coupled to the DC link capacitor, wherein during a first condition when the inverter is operating, heat is transferred from the DC link capacitor to the plurality of coolant conduits, and during a second condition when the inverter is not operating, heat is reduced in the DC link capacitor by discharging electricity stored in the DC link capacitor via the discharge resistor. In a first example of the system, heat is transferred from the DC link capacitor to the plurality of coolant conduits via a thermal pad. In a second example of the system, optionally including the first example, a cooling plate is included between the surface of the DC link capacitor and the thermal pad. In a third example of the system, optionally including one or both of the first and second examples, the DC link capacitor and thermal pad are enclosed within a first compartment of the inverter, a control circuit board is enclosed within a second compartment of the inverter, and external communication components of the inverter are enclosed within a third compartment of the inverter, the first, second, and third compartments having varying levels of electromagnetic interference (EMI). In a fourth example of the system, optionally including one or more or each of the first through third examples, the DC link capacitor is electrically coupled to the discharge resistor via one of an electrical spring connector and a bar bus positioned between a DC bus bar of the inverter and a control circuit board of the inverter.

The disclosure also provides support for an inverter, comprising: a plurality of compartments enclosing different components of the inverter, each compartment of the plurality of compartments having a different level of electromagnetic interference (EMI), wherein one compartment of the plurality of compartments includes a direct current (DC) link capacitor electrically coupled to a discharge resistor, the DC link capacitor positioned adjacent to a cooling system, a surface of the DC link capacitor separated from a surface of the cooling system by a cooling plate and a thermal pad. In a first example of the system, the cooling system comprises a plurality of coolant conduits through which a coolant is flowed, the coolant entering the inverter via a coolant inlet of the inverter and exiting the inverter via a coolant outlet of the inverter.

While various embodiments have been described above, it should be understood that they have been presented by way of example, and not limitation. It will be apparent to persons skilled in the relevant arts that the disclosed subject matter may be embodied in other specific forms without departing from the spirit of the subject matter. The embodiments described above are therefore to be considered in all respects as illustrative, not restrictive.

It will be appreciated that the configurations and routines disclosed herein are exemplary in nature, and that these specific embodiments are not to be considered in a limiting sense, because numerous variations are possible. As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

FIGS. 1-9 show example configurations with relative positioning of various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space there-between and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. An inverter, comprising: a first compartment including: a direct current (DC) link capacitor that is electrically coupled to a discharge resistor; and a thermal pad in contact with the DC link capacitor; a cooling system configured to circulate coolant through a housing adjacent to the thermal pad; a noise filtering ferrite element coupled to a DC bus bar; and further comprising a cooling plate arranged at a surface of the DC link capacitor between the DC link capacitor and the thermal pad.

2. The inverter of claim 1, wherein the cooling plate is manufactured out of aluminum.

3. The inverter of claim 1, wherein the cooling plate includes a portion positioned between the DC link capacitor and the cooling system, and a portion positioned between other components of the inverter and the cooling system.

4. The inverter of claim 1, wherein the coolant is directly routed from an inlet of the inverter to a plurality of coolant conduits of the cooling system arranged adjacent to a side of the DC link capacitor, the plurality of coolant conduits and the side of the DC link capacitor separated by the cooling plate.

5. The inverter of claim 1, wherein the DC link capacitor is electrically coupled to the discharge resistor via an electrical spring connector.

6. The inverter of claim 1, wherein the DC link capacitor is electrically coupled to the discharge resistor via one or more bar busses between a DC bus bar of the inverter and a control circuit board of the inverter.

7. The inverter of claim 1, wherein the discharge resistor is in thermal contact with a housing of the invertor via a thermal pad.

8. The inverter of claim 7, wherein the discharge resistor is positioned within a recess of the thermal pad, the recess designed to increase an amount of heat transferred from the discharge resistor to the housing.

9. The inverter of claim 7, wherein sections of the thermal pad are in contact with a lower surface of a control circuit board.

10. The inverter of claim 1, wherein the discharge resistor is configured to passively discharge without any control inputs.

11. The inverter of claim 1, further comprising a second compartment including a control circuit board, wherein the first and second compartment have varying levels of electromagnetic interference (EMI).

12. The inverter of claim 1, further comprising a third compartment with external communication components positioned therein, wherein the first, second, and third compartment have varying levels of EMI.

13. A cooling system for an inverter, the cooling system comprising: a plurality of coolant conduits through which a coolant is directed to transfer heat out of the inverter, the plurality of coolant conduits adjacent to a surface of a direct current (DC) link capacitor of the inverter; and a discharge resistor electrically coupled to the DC link capacitor; wherein during a first condition when the inverter is operating, heat is transferred from the DC link capacitor to the plurality of coolant conduits; and during a second condition when the inverter is not operating, heat is reduced in the DC link capacitor by discharging the DC link capacitor via the discharge resistor; wherein heat is transferred from the DC link capacitor to the plurality of coolant conduits via a thermal pad and wherein a cooling plate is included between the surface of the DC link capacitor and the thermal pad.

14. The cooling system of claim 13, wherein the DC link capacitor and thermal pad are enclosed within a first compartment of the inverter, a control circuit board is enclosed within a second compartment of the inverter, and external communication components of the inverter are enclosed within a third compartment of the inverter, the first, second, and third compartments having varying levels of electromagnetic interference (EMI).

15. The cooling system of claim 13, wherein the DC link capacitor is electrically coupled to the discharge resistor via one of an electrical spring connector and a bar bus positioned between a DC bus bar of the inverter and a control circuit board of the inverter.

16. An inverter, comprising:
a plurality of compartments enclosing different components of the inverter, each compartment of the plurality of compartments having a different level of electromagnetic interference (EMI);
wherein one compartment of the plurality of compartments includes a direct current (DC) link capacitor electrically coupled to a discharge resistor, the DC link capacitor positioned adjacent to a cooling system, a surface of the DC link capacitor separated from a surface of the cooling system by a cooling plate and a thermal pad.

17. The inverter of claim 16, wherein the cooling system comprises a plurality of coolant conduits through which a coolant is flowed, the coolant entering the inverter via a coolant inlet of the inverter and exiting the inverter via a coolant outlet of the inverter.

* * * * *